United States Patent [19]

Yoon et al.

[11] Patent Number: 5,478,973
[45] Date of Patent: Dec. 26, 1995

[54] SEMICONDUCTOR CHIP CONTACT BUMP STRUCTURE

[75] Inventors: Jin H. Yoon, Chonan; Seung H. Chae, Pusan-jikal, both of Rep. of Korea

[73] Assignee: Samsung Electronics Co., Inc., Suwon, Rep. of Korea

[21] Appl. No.: 268,947

[22] Filed: Jun. 30, 1994

[30] Foreign Application Priority Data

Jun. 30, 1993 [KR] Rep. of Korea .................. 93-12410

[51] Int. Cl.⁶ .................................................. H05K 1/18
[52] U.S. Cl. ..................... 174/260; 174/261; 174/250; 361/760; 361/767
[58] Field of Search ................................ 174/250, 256, 174/257, 260, 267, 261; 228/179, 180.1, 180.2; 361/760, 767; 428/901

[56] References Cited

U.S. PATENT DOCUMENTS

| | | |
|---|---|---|
| 4,341,594 | 7/1982 | Carlson et al. . |
| 5,134,460 | 7/1992 | Brady et al. . |
| 5,260,518 | 11/1993 | Tanaka et al. ................ 174/261 |
| 5,293,006 | 3/1994 | Yung ............................ 174/261 |
| 5,349,500 | 9/1994 | Casson et al. . |

OTHER PUBLICATIONS

Tovar, D., Optimization of a Gold Bump Process for Tab by Statistically Designed Experimentation, Itab 1991 Proceedings, 1991 STC.

*Primary Examiner*—Laura Thomas
*Attorney, Agent, or Firm*—Cushman Darby & Cushman

[57] ABSTRACT

A semiconductor contact bump structure is disclosed in which at least one contact bump is formed on an electrode pad of a semiconductor substrate through a contact window formed in a passivation layer on the semiconductor substrate. The contact bump has different lengths along respective perpendicular directions. In a first direction, the bump covers first edges of the passivation layer which define the contact window, while in a second direction, the contact bump is formed to be fully between second edges of the passivation layer defining the contact window. Such a construction results in a chip bump having an upper surface which is concavely curved along the first direction. By attaching leads to the bump along the second direction, junction resistance is advantageously lowered and noise generation is controlled to improve reliability of a semiconductor package. Also, shorting of the lead is prevented owing to the strong bonding force to improve yield of the semiconductor package.

7 Claims, 5 Drawing Sheets

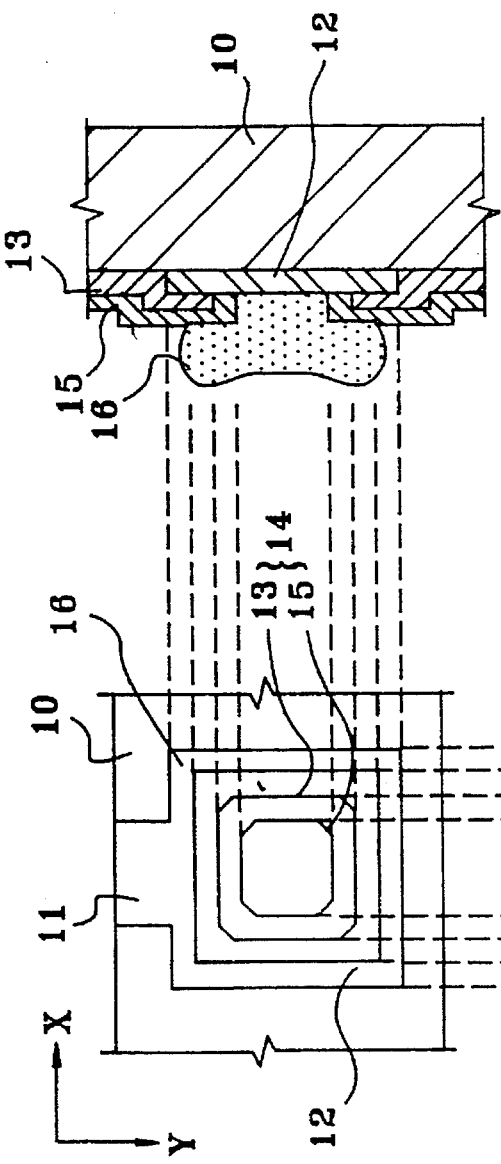
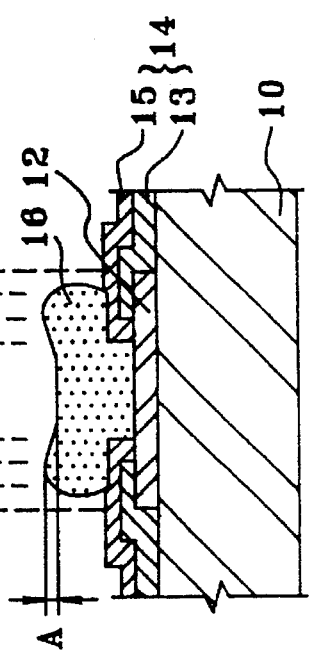
FIG. 1A PRIOR ART
FIG. 1B PRIOR ART
FIG. 1C PRIOR ART 5,478,973

SEMICONDUCTOR CHIP CONTACT BUMP STRUCTURE

BACKGROUND OF THE INVENTION

1. Field of the Invention

The present invention relates to a semiconductor chip structure having at least one contact bump, and more particularly to a semiconductor chip structure with a plurality of contact bumps, wherein a given contact bump formed on an electrode pad of the semiconductor substrate is differently sized with respect to an X-axis direction and an Y-axis direction and, at the same time, an elongated offset formed in the upper portion of the bump is formed with its curvature only along a transverse direction, thereby preventing a bonding failure between the bump and lead due to the offset of the bump.

2. Description of Related Art

Generally, semiconductor chips of integrated circuits, large-scale integrated circuits, and the like are sealed in a package type of encapsulating resin, and mounted on a printed circuit board (hereinafter referred to as "PCB").

The semiconductor chip is typically mounted on a square die pad via a die attachment process, with input/output lead pins being arranged on the sides of the die pad by a predetermined interval. One end of the lead is connected by a wire to an electrode pad of the semiconductor chip via a wire bonding process.

Also, a package body is protectively formed via a molding process around the semiconductor chip and wires. Other ends of the leads protrude from one side of the package, and are bent via a bending process to be suitable for mounting.

Along with the trend towards manufacturing lightweight, simplified, and miniaturized semiconductor products, larger pin counts and thinness are continuously sought in semiconductor packages for high density mounting, but improvements in mounting is limited when using the conventional semiconductor package.

Therefore, a chip on board ("COB") method for directly mounting bare chips onto the PCB, a tape automated bonding ("TAB") method (wherein die pads and wires, which occupy a significant area in a semiconductor package, are eliminated) to directly attach bare chips to leads, and similar methods are newly-developed and employed.

According to the TAB method, contact bumps of a predetermined height are formed on the electrode pads of the semiconductor chips, and thin leads are thermally compressed onto the bumps to attach them.

In the TAB package, which is a kind of a surface mounting technique, one end of the lead having a thin copper film subjected to a photo lithography on an insulating film is connected to a bump formed on the electrode pad of the semiconductor chip. The TAB package has been used in a low pin-small chip apparatus such as a watch and a calculator, and is being pursued in large-sized memory devices with multiple pin counts such as a liquid crystal display driver, ASIC and a microcomputer.

The semiconductor chip bumps applied to the semiconductor package are generally formed through an electroplating method having an excellent productivity, a transferring process, or a dotting method of a photoresist-type conductive layer for selectively forming the bumps by identifying defective chips.

FIGS. 1A to 4 illustrate a conventional semiconductor chip bump 16 which will be utilized for description. Here, the same parts are designated by same reference numerals.

FIG. 1A is a plan view schematically showing the upper surface of an electrode pad formed on a semiconductor substrate. FIG. 1B is a section view of the semiconductor structure longitudinally cutting FIG. 1 in an Y-axis direction. FIG. 1C is a cross section view cutting FIG. 1A in an X-axis direction.

Referring to FIG. 1A, a rectangular electrode pad 12 made from an aluminum material like aluminum or an aluminum alloy and connected to a signal line 11 is formed on a semiconductor substrate 10 as part of a predetermined circuit thereon. A passivation layer 14 having a double layer structure obtained by sequentially stacking layers of predetermined materials, (e.g., a silicon oxide layer 13 and a silicon nitride layer 15) is formed on the surface of the surface of the semiconductor substrate 10 having pad 12 formed thereon.

At this time, the central portion of the electrode pad 12 is then exposed through passivation layer 14 through an opening of a predetermined shape, (e.g., an octagon obtained by cutting corners of a regular square or the uncut regular square). The silicon nitride layer 15 of passivation layer 14 covers an edge of the silicon oxide layer 13 adjacent to this opening by approximately 5 μm.

A barrier metal layer (not shown) is formed of a metal having excellent processing and attachment properties is formed over the aluminum electrode pad 12 exposed by the opening in passivation layer 14 and on the upper portion of the edge of the passivation layer 14, to improve the bonding force of the bump 16 and to prevent diffusion to the electrode pad 12.

Referring to FIGS. 1B and 1C for observing the above-described structure, the bump 16 is formed via the electroplating method, and is smaller in dimension than the overall electrode pad 12, but greater in dimension than the portion of the electrode pad 12 exposed by the contact window in the passivation layer 14.

The electroplating method is performed in such a manner that the semiconductor substrate 10 having the barrier metal layer exposed via a photoresist pattern formed thereover (not shown) is immersed into a plating solution of gold (Au). Then, a predetermined voltage is supplied to the barrier metal layer to form the bump 16, and then portions of the barrier metal layer left exposed around the photo resist pattern and around the bump 16 are eliminated.

When viewed from the top, the bump 16 is squared (see FIG. 1A), and the center of the upper surface of the bump 16 is hollowed or dimpled to form an offset A between the center and the periphery, so that the overall shape crater-like or bowl-like.

FIG. 2 is a plan view showing a lead attached on the conventional bump 16 formed on the upper surface of the electrode pad shown in FIG. 1A.

Referring to FIG. 2, lead 18 composed of the thin copper film is attached onto the bump 16 formed as above via a thermal compression method. A tin (Sn) film (not shown) is coated on one side of the lead 18 to improve bonding force between the lead 18 and the bump 16, and a fillet 19, formed of an alloy of gold (Au) and tin (Sn), is formed on the junction portion with the bump 16.

Since the above-described conventional bump is bowl-like with a hollowed center thereof, there is an offset A between the periphery and center portions of the chip bump 16. Thus, as can be noted from the section views shown in FIGS. 3 and 4, the lead 18 connect to the bump 16 contacts the bump 16 only a periphery of the bump 16 surrounding the bowl-like area. Junction resistance is thereby increased, which causes noise and degrades the reliability of the semiconductor package.

Moreover, the bonding force between the lead and bump is so weak (by about 20 to 35 gr) that a rate of contact shorting of the lead reaches about 30%, thereby lowering yield of the semiconductor package.

Therefore, in the above-described methods, the conventional chip bumps are difficult to manufacture in a uniform shape, resulting in problems of manufacturing cost, delivery date, etc. For this reasons, study of ideal processing condition which do not produce the offset of the bump via the common electroplating method, of the designing state of the electrode pad, and the like has been actively conducted.

For example, as disclosed in "Optimization of a Gold Bump Process for TAB by Statistically Designed Experimentation" written by David Tovar in ITAB 91 proceeding, pages 1–15, experiments about the influences on the reliability of the semiconductor chip are carried out according to the dimension of a contact window for exposing an electrode pad, the hardness of a bump, and a passivation rate of the surface of a barrier metal layer, which are varied in accordance with conditions of the thermal processing after forming the bump.

However, a bump of an excellent reliability can be obtained under the optimal state without requiring an additional process in manufacturing the bump by finding out the optimal states for process and design, but the optimal state is difficult to determine. Furthermore, if external factors, such as the kind of semiconductor chip and replacement of apparatuses is changed, the optimal state also changes, thereby restricting the range of application.

SUMMARY OF THE INVENTION

The present invention is contrived to solve the above-described problems.

Accordingly, it is an object of the present invention to provide a semiconductor structure with chip bumps, wherein the semiconductor chip bumps are formed with a unidirectional curvature transverse to the direction of leads connected thereto, so that an area for contacting the leads is enlarged to improve reliability of the bonding force and simplify the overall manufacturing process.

It is an another object of the present invention to provide a semiconductor structure with chip bumps, wherein a bonding force between leads and bumps is advantageously increased to prevent short of the leads, thereby improving yield of a semiconductor package.

To achieve the above object of the present invention, a semiconductor chip structure is provided with bumps of a predetermined shape formed on electrode pads on the inside of contact windows formed in the passivation layer of the chip structure. Here, a bump in a Y-axis direction is formed no wider than a respective contact window in the Y-axis direction, and wider than at least the contact window in the X-axis direction, so that the bumps in the X-axis direction are formed to overlap a portion of the passivation layer and formed in the Y-axis direction within the width of the contact windows. The edges of the offset, or dimpled portion, of the chip bump are raised relative to the center where the chip bump material covers the edges of the window in the passivation layer. Therefore, because the chip bump according to the present invention is formed with a width in one direction no greater than that of the respective contact window (i.e., the chip bump does not cover the edges of the contact window), the chip bump is curved only in one direction, and not in all directions like a bowl. Therefore, a lead can be attached to the bump along a direction perpendicular to the direction in which it curves (see FIG. 8) to thereby improve bonding strength.

BRIEF DESCRIPTION OF THE DRAWINGS

The above objects and other advantages of the present invention will become more apparent by describing in detail preferred embodiments thereof with reference to the attached drawings in which:

FIG. 1A is a plan view schematically showing the upper surface of an electrode pad formed on a semiconductor substrate;

FIG. 1B is a section view of the semiconductor structure longitudinally cutting FIG. 1A in an Y-axis direction;

FIG. 1C is a cross section view thereof cutting FIG. 1 in an X-axis direction;

DETAILED DESCRIPTION OF THE PREFERRED EMBODIMENT

Figure 2:
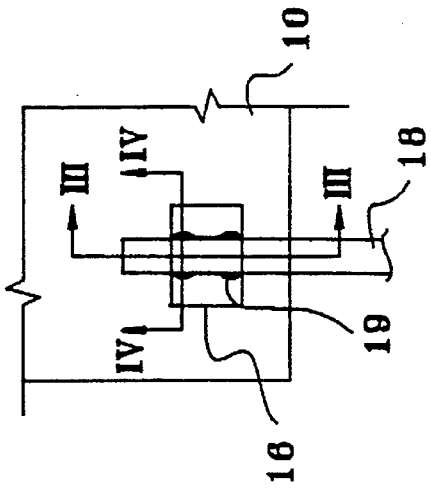
FIG. 2 is a plan view showing a lead attached onto the bumps formed on the upper surface of the electrode pad of FIG. 1A.
Figure 4:
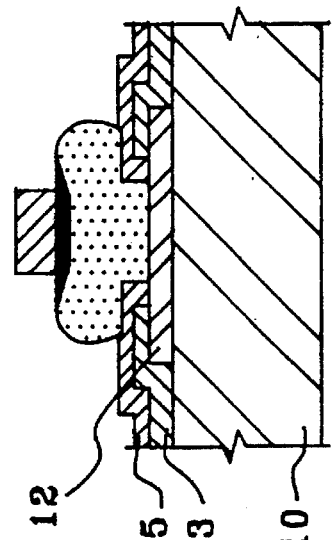
FIG. 4 is a section view showing the conventional semiconductor structure with bumps taken along line III—III of FIG. 2.
Figure 3:
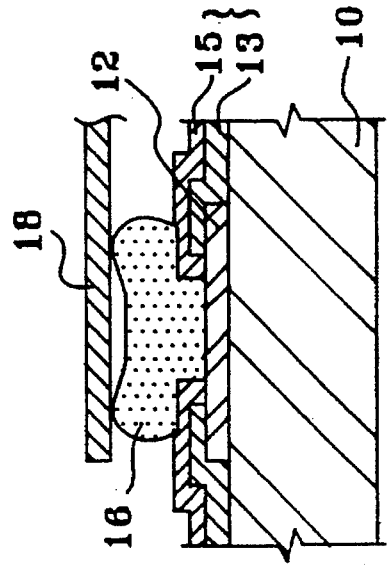
FIG. 3 is a section view showing the conventional semiconductor structure with bumps, taken along line IV—IV of FIG. 2.

Referring to FIGS. 5A to 5D showing a semiconductor structure with bumps according to the present invention, a rectangular electrode pad 22 connected to a signal line 21 is formed on a semiconductor substrate 20. The electrode pad 22 is formed of the same material as the signal line 21, (e.g., an aluminum or aluminum alloy). A passivation layer 24 is formed on the surface of the semiconductor substrate 20, and has a double layered structure obtained by sequentially stacking layers of a predetermined material, (e.g., a silicon oxide layer 23 and a silicon nitride layer 25).

A contact window 27 is formed in passivation layer 24 to expose a portion of the electrode pad 22. The silicon nitride layer 25 extends to the inside of the contact window 27 to slightly cover the edge of the silicon oxide layer 23 by, e.g., approximately 5 μm, where the silicon nitride layer 25 can be constantly apart from the edge portions of the silicon oxide layer 23. A rectangular chip bump 26 (refer to FIG. 5B) formed of gold (Au), for example, is provided on the portion of electrode pad 22 exposed through the contact window 27.

The bumps 26 according to present invention are greater in width than the contact window 27 in an X-axis direction, slightly smaller than the electrode pads 22 in that same direction. Also, the bumps 26 in the Y-axis direction (perpendicular to the X-axis direction) are formed to be the about the same width or smaller than the contact window in the Y-axis direction or smaller than that of the contact window 27 in consideration of the expansion during attaching the bump to the lead. At this time, the bump 26 has an offset B between the periphery and center only in the X-axis direction (see FIG. 8), and does not have an offset in the Y-axis direction (see FIG. 7) because the bump is no greater than the dimension of the contact window 27 in the Y-axis direction. The bump 26 in the X-axis direction is larger than that of the contact window 27 by approximately 10 to 20 μm, but smaller than the electrode pad 22 by approximately 10 to 20 μm.

The bump 26 is formed via a predetermined method, e.g., an electroplating method or transferring process. Here, the electroplating method is discussed by way of an example.

Figure 5B:
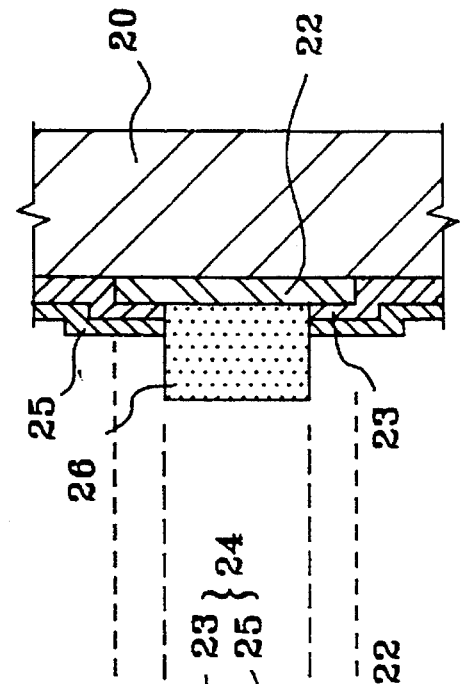
FIG. 5B is a section view of the semiconductor structure longitudinally cutting FIG. 5A in an Y-axis direction.
Figure 5A:
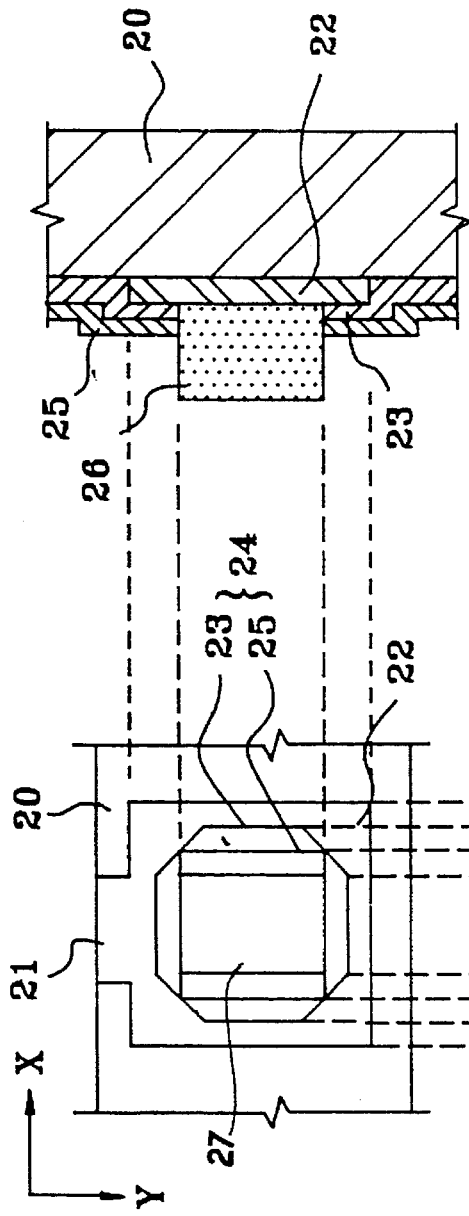
FIG. 5A is a plan view schematically showing the upper surface of an electrode pad formed on a semiconductor substrate.
Figure 5C:
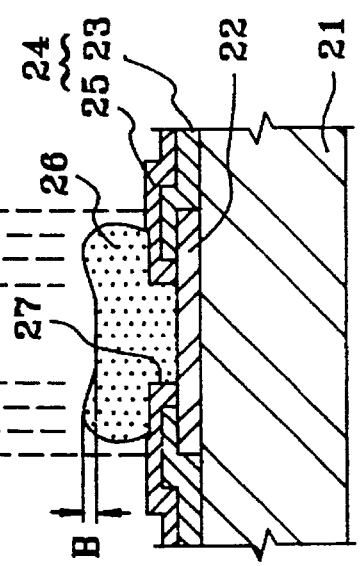
FIG. 5C is a cross section view cutting FIG. 5A in an X-axis direction.
Figure 5D:
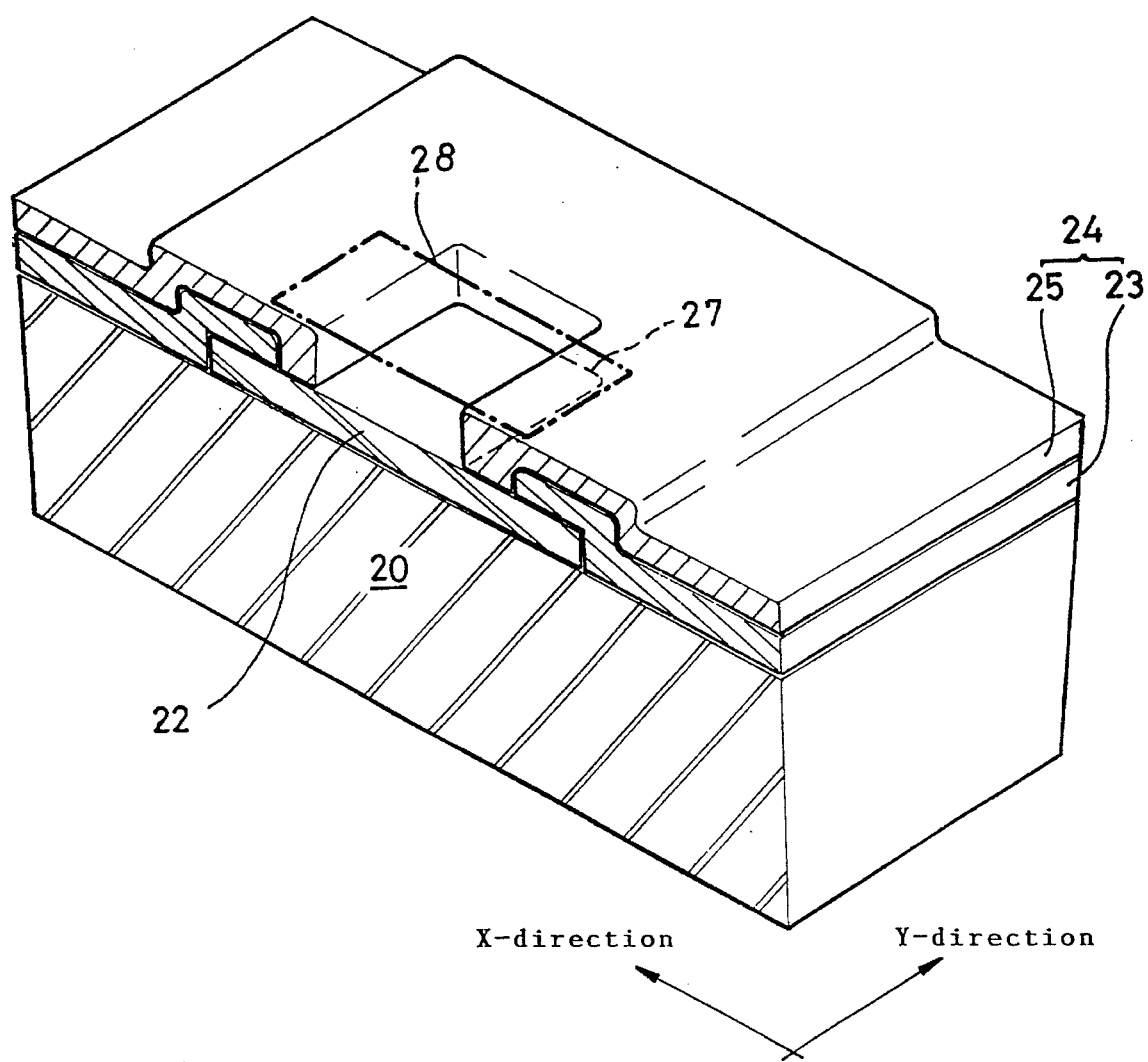
FIG. 5D is a perspective view of the semiconductor structure seen in FIG. 5A.

The size at the lower surface of a photoresist pattern (not shown) (which is a mask in the X-axis direction) is formed to be greater than the contact window 27 by about 10 to 20 μm, and but smaller than the contact window 27 in the Y-axis direction (as indicated at 28 in FIG. 5D). Thus, the contact window 27 is exposed in the shape of a rectangle. The semiconductor substrate 20 is then immersed into a plating solution of gold (Au). Then, a predetermined voltage is applied to a barrier metal (not shown) to form the bump 26.

Successively, a barrier metal layer (not shown) is formed on the exposed portion of the electrode pad 22 and on surrounding parts of passivation layer 24. The barrier metal layer is for increasing the adherence to the bump 26 and for preventing the diffusion to the electrode pad 22. The barrier metal layer is formed of a metal having excellent processing and attachment properties, such as a double layer of chromium (Cr) and copper (Cu) or a single layer of titanium (Ti), palladium (Pd), or tungsten titanium (TiW), to a thickness of about 2,000 Å.

Figure 6:
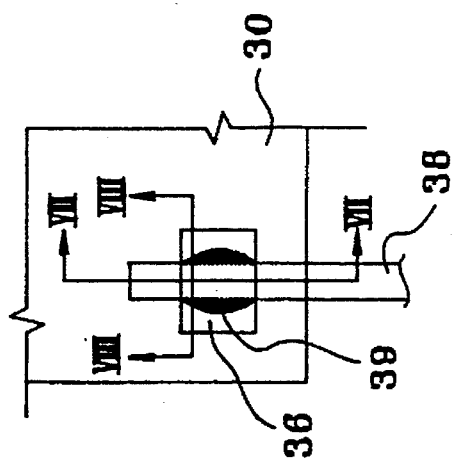
FIG. 6 is a plan view showing a lead attached onto the bumps formed on the upper surface of the electrode pad of FIG. 5.

FIG. 6 is a plan view showing a lead attached to a chip bump formed on the upper surface of the electrode pad of FIG. 5A.

Figure 8:
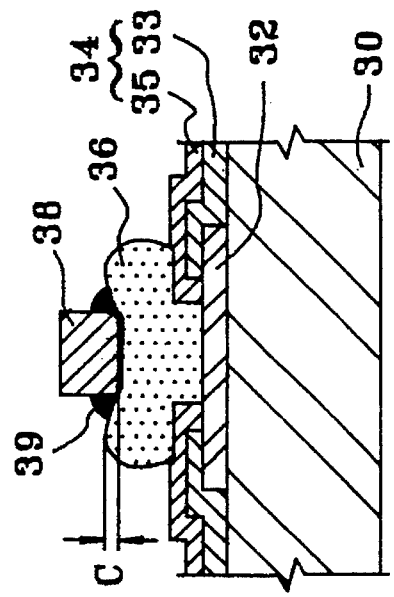
FIG. 8 is a section view showing the semiconductor structure with bumps according to the present invention taken along line VIII—VIII of FIG. 6.
Figure 7:
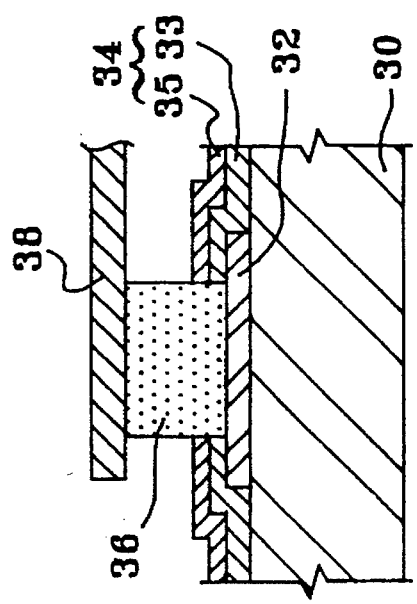
FIG. 7 is a section view showing the semiconductor structure with bumps according to the present invention taken along line VII—VII of FIG. 6.

Referring to FIG. 7, a window is formed in passivation layer 34 to expose a portion of electrode pad 32. Bump 36 is then formed on the electrode pad 22. The bump 36 is larger than the exposed portion electrode pad 32 in the X-axis direction, but smaller than or the same size as the exposed portion of electrode pad 32 in the Y-axis direction, to thereby have a rectangular shape. As shown in FIG. 8, which is a section view of the semiconductor chip with bumps in the X-axis direction, the edge portion of the upper surface of the bump 36 is thickly formed due to the characteristic of the electroplating method, so that an offset C appears between the periphery and the center thereof, while there is no offset in the Y-axis direction, as seen in FIG. 7.

A lead 38 is attached to the bump 36 via a predetermined method, e.g., thermal compression method. The lead 38 is a thin lead for the TAB package, which is formed by a thin copper film attached on an insulating tape (not shown) by performing a photo lithography thereon. Since a tin(Sn) or solder(Sn/Pb with above 90% of Sn) is plated electrolytically or non-electrolytically on the lead 38 to improve the bonding force to the bump 36, a fillet 39 made from an alloy of gold (Au) and Tin (Sn) or an alloy of gold (Au) and solder (Sn/Pb) is formed on the attaching portion to the bump 36 and is consistently distributed around the attached plane of the bump 36 and lead 38 (refer to FIG. 6)

When referring to section views of FIG. 7 and FIG. 8, showing the semiconductor structure with bumps taken along lines VII—VII and VIII—VIII of FIG. 6, the lead 38 linearly contacts the bump 36 in the Y-axis direction and the fillet 39 fills the offset along the X-axis direction to complete the linear contact. Accordingly, the fillet 39 improves an area contact between the lead and the bump to increase the bonding force therebetween by 35 to 50 gr, or twice that of the conventional apparatus.

If the bump were to be formed without an offset in either direction, it would be too small to provide a sufficient junction area. Therefore, the bump is formed to have the offset only in one direction as described above to obtain the necessary junction area with a precision capable of securing reliability.

In the semiconductor chip with bumps according to the present invention as described above, a passivation layer is formed on the surface of a semiconductor substrate having an electrode pad, and a portion of the passivation layer is removed to form a contact window which exposed the electrode pad. Additionally, the bump formed on the exposed electrode pad has different dimensions in the longitudinal and transverse directions.

As a result, the leads have improved contact with the respective bumps with lower junction resistance and noise generation, so that the reliability of the semiconductor package is improved. Moreover, the bonding force becomes strong to prevent the short of the lead, thereby improving the yield of the semiconductor package. Also, since the bump is small, there is an additional effect of saving the material for forming the bump to reduce manufacturing cost. A bump which has the same reliability in attachment regardless of external state of a process for forming the bump and designing condition can be formed, thereby showing high compatibility.

As described above, since the semiconductor structure with bumps according to the present invention can not only be varied in comply with a semiconductor structure, usage and overall types but also change the size of the bump applied, it will be understood by those skilled in the art that various changes in form and details may be effected therein without departing from the spirit and scope of the invention as defined by the appended claims.

What is claimed is:

1. A semiconductor chip contact bump structure comprising:

a semiconductor substrate;

an electrode pad formed on said semiconductor substrate;

a passivation layer formed over said semiconductor substrate and said electrode pad formed on said semiconductor substrate, said passivation layer having a contact window formed therethrough to expose at least a portion of said electrode pad, said contact window being defined by a pair of opposing first edges of said passivation layer and a pair of opposing second edges of said passivation layer; and a contact bump made from an electrically conductive material formed on said electrode pad through said contact window, wherein, along a first direction, said contact bump is wider than said contact window so as to cover said opposing first edges, and wherein, along a second direction perpendicular to said first direction, said contact bump is narrower than said opposing second edges, wherein at least a portion of an upper surface of said contact bump is curved in a concave manner along said first direction and is substantially flat along said second direction.

2. A contact bump structure according to claim 1, wherein said contact bump is made from an electroplated electrically conductive material.

3. A contact bump structure according to claim 1, wherein said electrode pad is made from an aluminum material.

4. A semiconductor chip comprising:

a substrate having a central area thereon provided with a circuitry pattern and a peripheral area surrounding said central area;

a plurality of electrode pads formed on said peripheral area;

a passivation layer covering said substrate and said plurality of electrode pads, said passivation layer having a plurality of contact windows, each contact window exposing a respective electrode pad and being defined by a pair of opposing first edges of said passivation layer and a pair of opposing second edges of said passivation layer;

a plurality of contact bumps, each contact bump of said plurality of contact bumps being formed on a respective electrode pad exposed through a respective contact window, wherein said plurality of contact bumps are made from an electrically conductive material, each contact bump being wider than a corresponding contact window along a first direction parallel to said pair of opposing first edges so as to cover a portion of said passivation layer and being narrower than said corresponding window along a second direction parallel to said opposing second edges of said contact window, wherein each contact bump has an upper surface which is curved along said first direction and is substantially flat along said second direction.

5. A semiconductor chip according to claim 4, wherein said plurality of contact bumps are made from an electroplated electrically conductive material.

6. A semiconductor chip contact bump structure comprising:

a semiconductor substrate;

an electrode pad formed on said semiconductor substrate;

a passivation layer formed over said semiconductor substrate and said electrode pad formed on said semiconductor substrate, said passivation layer having a contact window formed therethrough to expose at least a portion of said electrode pad; and a contact bump made from an electrically conductive material formed on said electrode pad through said contact window, wherein an upper surface of said contact bump is curved in a concave manner along said first direction and is substantially flat along said second direction.

7. A semiconductor chip comprising:

a substrate having a central area thereon provided with a circuitry pattern and a peripheral area surrounding said central area;

an electrode pad formed on said peripheral area;

a passivation layer covering said substrate and said electrode pad, said passivation layer having a contact window formed therethrough exposing said electrode pad;

a contact bump formed on said electrode pad exposed through said contact window, wherein said contact bump has an upper surface which is curved along a first direction and is substantially flat along said second direction.

* * * * *